(12) United States Patent
Kakino

(10) Patent No.: US 8,192,802 B2
(45) Date of Patent: Jun. 5, 2012

(54) PHOTOCURABLE COATING COMPOSITION, AND OVERPRINT AND PROCESS FOR PRODUCING SAME

(75) Inventor: Ryuki Kakino, Haibara-gun (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 898 days.

(21) Appl. No.: 12/206,380

(22) Filed: Sep. 8, 2008

(65) Prior Publication Data

US 2009/0081375 A1 Mar. 26, 2009

(30) Foreign Application Priority Data

Sep. 26, 2007 (JP) .................................. 2007-249385

(51) Int. Cl.
*C08J 7/18* (2006.01)
(52) U.S. Cl. ......................................... 427/487; 427/490
(58) Field of Classification Search ............. 252/182.28, 252/182.15; 427/487, 490
See application file for complete search history.

(56) References Cited

U.S. PATENT DOCUMENTS

| 6,140,408 A | 10/2000 | McCarthy et al. |
| 2005/0038137 A1 | 2/2005 | Yoshihara et al. |
| 2005/0250038 A1 | 11/2005 | McAneney et al. |
| 2007/0021522 A1 | 1/2007 | Halfyard et al. |
| 2008/0233493 A1 | 9/2008 | Ishizeki et al. |

FOREIGN PATENT DOCUMENTS

| EP | 1193551 A2 | 4/2002 |
| JP | 61-210365 A | 9/1986 |
| JP | 11-070647 A | 3/1999 |
| JP | 2003-241414 A | 8/2003 |
| JP | 2005-321782 A | 11/2005 |
| WO | WO 2006/129800 A1 | 12/2006 |
| WO | WO 2007/058355 A1 | 5/2007 |
| WO | WO 2007/061115 A1 | 5/2007 |
| WO | WO 2007058355 A1 * | 5/2007 |

OTHER PUBLICATIONS

English Abstract of the Patent WO 2007058355 Al dated May 24, 2007.*
Office Action mailed Feb. 22, 2012, in corresponding Chinese Application No. 200810186898.0.

* cited by examiner

*Primary Examiner* — Eisa Elhilo
(74) *Attorney, Agent, or Firm* — Buchanan Ingersoll & Rooney PC

(57) ABSTRACT

A process for producing an overprint is provided that includes a step of preparing a printed material printed on a printing substrate, a step of coating the printed material with a photocurable composition, and a step of photocuring the photocurable composition, the photocurable composition comprising (I) a fluorine-containing polymer having an ethylenically unsaturated group, (II) an ethylenically unsaturated compound, and (III) a photopolymerization initiator. There are also provided an overprint produced by the production process, and the photocurable composition.

26 Claims, No Drawings

PHOTOCURABLE COATING COMPOSITION, AND OVERPRINT AND PROCESS FOR PRODUCING SAME

BACKGROUND OF THE INVENTION

1. Field of the Invention

The present invention relates to a photocurable coating composition, and to an overprint and a process for producing same. More particularly, the present invention relates to a photocurable coating composition that is curable upon exposure to actinic radiation such as an electron beam or UV rays. In particular, it relates to a photocurable coating composition for coating an image formed by depositing ink and/or toner on a printing substrate (image receiving substrate) by a method such as lithography, relief printing, intaglio printing, screen printing, inkjet, or electrophotography. More particularly, it relates to a photocurable overprint composition (overprint composition) particularly suitably used for coating a toner-based printed material printed by an electrophotographic process.

2. Description of the Related Art

In recent years, a large number of actinic radiation curable compositions that can be used in UV curable printing inks, paints, and coatings have been developed, and the spreading thereof is currently being promoted. However, it is at present difficult to obtain a photocurable composition that satisfies all requirements in terms of curability, surface smoothness, strength, storage stability, etc.

In particular, when a layer of fuser oil is present on the surface of a toner-based image such as one obtained by an electrophotographic process, it is yet more difficult to obtain desired performance.

In a standard method for forming a toner-based image, such as an electrophotographic process, an electrostatic charge is formed on a latent image retaining surface by uniformly charging a latent image retaining surface such as, for example, a photoreceptor. Subsequently, charge on the uniformly charged region is selectively released by a pattern of activation irradiation corresponding to an original image. The latent image charge pattern remaining on the surface corresponds to regions that have not been exposed to radiation. Subsequently, the photoreceptor is passed through one or a plurality of development housings containing toner, and since the toner is deposited on the charge pattern by electrostatic attractive force, the latent image charge pattern is visualized. Subsequently, the developed image is either fixed on an image-forming surface or transferred to a printing substrate such as, for example, paper and fixed thereto by an appropriate fixation technique, thus giving an electrophotographically printed material, that is, a toner-based printed material.

As a known method for protecting a printed material, applying an overprint coating to the printed material has been proposed. For example, JP-A-11-70647 and JP-A-2003-241414 (JP-A denotes a Japanese unexamined patent application publication) propose a method such as an electrophotographic process, in which fixation is carried out after a transparent toner is transferred on top of a toner-based image, thus covering the surface.

Furthermore, JP-A-61-210365 proposes a method in which an overprint coating is applied by applying a liquid film coating that is curable by UV rays, etc. and polymerizing (crosslinking) a coating component by means of light.

Furthermore, JP-A-2005-321782 discloses an overprint composition comprising a radiation curable oligomer selected from the group consisting of trifunctional unsaturated acrylic resins, a radiation curable monomer selected from the group consisting of polyfunctional alkoxylated acrylic monomers and polyalkoxylated acrylic monomers, such as one type or a plurality of types of diacrylate or triacrylate, at least one type of photopolymerization initiator, and at least one type of surfactant.

BRIEF SUMMARY OF THE INVENTION

It is an object of the present invention to provide a photocurable coating composition giving excellent surface smoothness, and an overprint having excellent non-tackiness and surface smoothness and a process for producing same by applying and curing the photocurable coating composition.

The above object has been attained by (1) to (19) below.

(1) A process for producing an overprint, the process comprising: a step of preparing a printed material printed on a printing substrate; a step of coating the printed material with a photocurable composition; and a step of photocuring the photocurable composition; the photocurable composition comprising (I) a fluorine-containing polymer having an ethylenically unsaturated group, (II) an ethylenically unsaturated compound, and (III) a photopolymerization initiator.

(2) The process for producing an overprint according to (1), wherein the fluorine-containing polymer (I) having an ethylenically unsaturated group comprises a monomer unit represented by Formula (1).

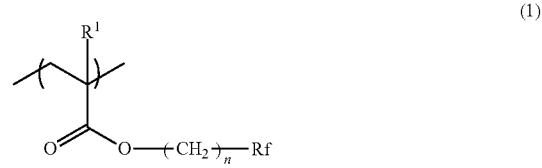

(1)

in Formula (1), Rf denotes a fluoroalkyl group or perfluoroalkyl group containing at least 5 fluorine atoms, n denotes 1 or 2, and $R^1$ denotes a hydrogen atom or a methyl group.

(3) The process for producing an overprint according (1) to (19), wherein the ethylenically unsaturated compound (II) comprises a monofunctional ethylenically unsaturated compound and a polyfunctional ethylenically unsaturated compound.

(4) The process for producing an overprint according to (1), wherein the photocurable composition is a composition that has substantially no absorption in the visible region.

(5) The process for producing an overprint according to (1), wherein the fluorine-containing polymer (I) having an ethylenically unsaturated group has a content of 0.001 to 40 wt % relative to the total weight of the photocurable composition.

(6) The process for producing an overprint according to (1), wherein the ethylenically unsaturated compound (II) has a content of 50 to 95 wt % relative to the total weight of the photocurable composition.

(7) The process for producing an overprint according to (1), wherein as the ethylenically unsaturated compound (II) a polyfunctional ethylenically unsaturated compound is contained at 5 to 60 wt % relative to the total weight of the photocurable composition.

(8) The process for producing an overprint according to (1), wherein the printing is electrophotographic printing, and the printed material is an electrophotographically printed material.

(9) The process for producing an overprint according to (1), wherein the electrophotographically printed material is an electrophotographically printed material having a fuser oil layer.
(10) The process for producing an overprint according to (1), wherein the amount of cured photocurable composition formed on the printed material is 1 to 10 g/m².
(11) The process for producing an overprint according to (1), wherein the cured photocurable composition on the printed material has a thickness of 1 to 10 µm.
(12) An overprint produced by the process for producing an overprint according to (1).
(13) A photocurable composition comprising: (I) a fluorine-containing polymer having an ethylenically unsaturated group; (II) an ethylenically unsaturated compound; and (III) a photopolymerization initiator.
(14) The photocurable composition according to (13), wherein the fluorine-containing polymer (I) having an ethylenically unsaturated group comprises a monomer unit represented by Formula (1).

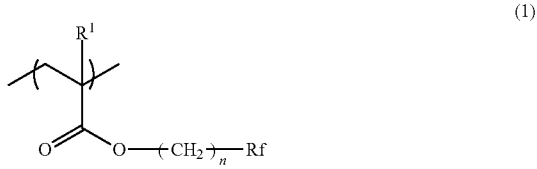

in Formula (1), Rf denotes a fluoroalkyl group or perfluoroalkyl group containing at least 5 fluorine atoms, n denotes 1 or 2, and $R^1$ denotes a hydrogen atom or a methyl group.
(15) The photocurable composition according to (13), wherein the ethylenically unsaturated compound (II) comprises a monofunctional ethylenically unsaturated compound and a polyfunctional ethylenically unsaturated compound.
(16) The photocurable composition according to (13), wherein the fluorine-containing polymer (I) having an ethylenically unsaturated group has a content of 0.001 to 40 wt % relative to the total weight of the photocurable composition.
(17) The photocurable composition according to (13), wherein the ethylenically unsaturated compound (II) has a content of 50 to 95 wt % relative to the total weight of the photocurable composition.
(18) The photocurable composition according to (13), wherein as the ethylenically unsaturated compound (II) a polyfunctional ethylenically unsaturated compound is contained at 5 to 60 wt % relative to the total weight of the photocurable composition.
(19) The photocurable composition according to (13), wherein it has substantially no absorption in the visible region.

DETAILED DESCRIPTION OF THE INVENTION

The process for producing an overprint of the present invention comprises; a step of preparing a printed material printed on a printing substrate; a step of coating the printed material with a photocurable composition; and a step of photocuring the photocurable composition; the photocurable composition comprising (I) a fluorine-containing polymer having an ethylenically unsaturated group, (II) an ethylenically unsaturated compound, and (III) a photopolymerization initiator.

A low surface energy polydimethylsiloxane, etc. is generally added to the photocurable coating composition as a leveling agent in order to improve the surface smoothness (JP-A-2005-321782). Materials such as polydimethylsiloxane contribute to improvement in the surface smoothness, but require a long waiting time during working in order for the surface to become fully smooth. Furthermore, since polydimethylsiloxane, etc. are liquid, there is the defect that the cured surface easily becomes tacky due to polydimethylsiloxane, etc. localized on the surface.

Although the mechanism of action of the present invention is not clear, it is surmised that use of a fluorine-containing polymer comprising a fluorine-containing monomer unit with a specific structure greatly reduces the surface energy of the photocurable coating composition and thus improves the surface smoothness.

On the other hand, in addition to the fluorine-containing monomer unit with a specific structure, the fluorine-containing polymer has an ethylenically unsaturated bond-containing group; a crosslinking reaction thereof with an ethylenically unsaturated compound contained in the photocurable coating composition of the present invention improves the film properties of the coating surface, thereby suppressing surface tackiness of the cured film. The present invention is explained in detail below.

Photocurable Coating Composition

The photocurable coating composition of the present invention preferably has substantially no absorption in the visible region. 'Having substantially no absorption in the visible region' means either having no absorption in a visible region of 400 to 700 nm or having only a level of absorption in the visible region that does not cause any problem as a photocurable coating composition. Specifically, a 5 µm optical path length transmittance of the coating composition in a wavelength region of 400 to 700 nm is at least 70%, and preferably at least 80%.

The photocurable coating composition of the present invention may suitably be used as one for an overprint, and may particularly suitably be used as one for an overprint for an electrophotographically printed material.

When the photocurable coating composition of the present invention is used for forming an overprint layer on an electrophotographically printed material having an image area with a thickness of a toner, an overprint with excellent non-tackiness and surface smoothness and having luster and gloss can be obtained, and an impression that it is visually close to a conventional silver halide photographic print can be given.

Furthermore, when the photocurable coating composition of the present invention is used for a toner image having a layer of fuser oil on the image surface, an image-printed material that has excellent non-tackiness and surface smoothness, has luster and gloss, has little distortion, and is highly flexible can be given, and an overprint that is visually close to a silver halide photographic print can be obtained.

(I) Fluorine-Containing Polymer Having an Ethylenically Unsaturated Group

The 'fluorine-containing polymer' means one containing a fluorine atom in a polymer. The 'fluorine-containing polymer having an ethylenically unsaturated group' means one having at least one ethylenically unsaturated group anywhere in the fluorine-containing polymer. The fluorine-containing polymer having an ethylenically unsaturated group (hereinafter, also called a 'specific fluorine-containing polymer' as appropriate), which is one component contained in the photocurable coating composition of the present invention, is explained in detail below.

In the present invention, the specific fluorine-containing polymer is not limited as long as it contains a fluorine atom in the molecule, and a polymer having a fluorine atom-containing group in a side chain is preferable. As the fluorine atom-containing group, a perfluoroalkyl group or fluoroalkyl group having 2 to 15 carbons is preferable, and a perfluoroalkyl group is more preferable.

Furthermore, the fluorine atom-containing group may be bonded directly to a polymer chain of the specific fluorine-containing polymer to thus form a side chain, but it is preferable for it to be bonded to the polymer chain of the specific fluorine-containing polymer via a polyvalent linking group, and it is more preferable for it to be bonded to the polymer chain of the specific fluorine-containing polymer via an alkylene group and a carboxylic acid ester group.

In the present invention, as the specific fluorine-containing polymer, any fluorine-containing polymer having an ethylenically unsaturated group may be used without limitation.

The ethylenically unsaturated group is not limited as long as it is a group having a radically polymerizable ethylenically unsaturated bond, and specific examples thereof include a (meth)acryloyl group (the description '(meth)acryloyl group' etc, means a 'methacryloyl group' or an 'acryloyl group', the same applies below), a (meth)acrylic group, a (meth)acryloylamide group, a styryl group, a vinyl group, an allyl group, a propenyl group, and a crotonyl group; among them a (meth)acryloyl group, a (meth)acryloylamide group, and an allyl group are preferable, and a (meth)acryloyl group and an allyl group are more preferable.

The ethylenically unsaturated group may be bonded directly to the polymer chain of the specific fluorine-containing polymer, but it is preferably bonded via a polyvalent linking group, which is described later.

In the present invention, the specific fluorine-containing polymer preferably comprises a monomer unit having a fluorine atom-containing group in a side chain (also called a 'fluorine-containing monomer unit') and a monomer unit having an ethylenically unsaturated group in a side chain.

Fluorine-containing Monomer Unit

In the present invention, the fluorine-containing monomer unit contained in the specific fluorine-containing polymer is preferably a monomer unit represented by Formula (1).

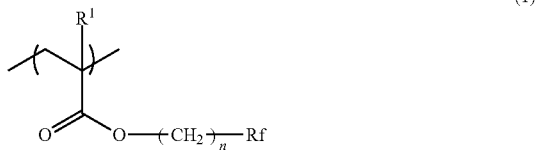

(1)

In Formula (1), Rf denotes a fluoroalkyl group or perfluoroalkyl group containing at least 5 fluorine atoms, n denotes 1 or 2, and $R^1$ denotes a hydrogen atom or a methyl group.

In Formula (1), the use of one in which Rf has at least 5 fluorine atoms enables the surface energy of the photocurable coating composition to be lowered, thus contributing to an improvement in surface smoothness.

Rf is preferably a fluoroalkyl group or perfluoroalkyl group represented by Formula (2).

(2)

In Formula (2), x denotes an integer of 2 to 15, y denotes an integer of 5 to 2x+1, and y+z is 2x+1.

x denotes the number of carbons contained in Rf; x is preferably 2 to 15, more preferably 2 to 12, and yet more preferably 2 to 8.

The number of fluorine atoms y is preferably 5 to 30, more preferably 9 to 25, and yet more preferably 9 to 17.

Use of a specific fluorine-containing polymer having fluorine atoms in this range enables excellent surface smoothness to be obtained. It is also preferable since degradation of solubility due to the oil repellency of fluorine atoms is avoided.

When Rf is a perfluoroalkyl group, $C_xF_{2x+1}$, Rf may be straight chain or branched, and a straight chain form, that is, $(CF_2)_xF$, is preferable. The range for x is the same as the above-mentioned range, and a preferred range is also the same.

When Rf is a fluoroalkyl group, Rf may be straight chain or branched, and a straight chain $(CF_2)_xH$ is preferable. The range for x is the same as the above-mentioned range, and a preferred range is also the same.

In the present invention, Rf is preferably a straight chain perfluoroalkyl group, and specific examples include a perfluoroethyl group, a perfluoropropyl group, a perfluorobutyl group, a perfluoropentyl group, a perfluorohexyl group, a perfluoroheptyl group, and a perfluorooctyl group, and among them a perfluoroethyl group, a perfluorobutyl group, a perfluorohexyl group, and a perfluorooctyl group are more preferable.

Furthermore, the proportion of the fluorine-containing monomer unit relative to the total monomer units contained in the specific fluorine-containing polymer is preferably 1 to 60 mol %, more preferably 3 to 50 mol %, yet more preferably 5 to 40 mol %, and particularly preferably 10 to 20 mol %. It is preferable for it to be in the above-mentioned range since a desired surface smoothness effect can be obtained. It is also preferable since the solubility of the specific fluorine-containing polymer in the photocurable coating composition is excellent.

Monomer Unit Having Ethylenically Unsaturated Group in Side Chain

In the present invention, the monomer unit having an ethylenically unsaturated group in a side chain is preferably a monomer unit represented by Formula (3).

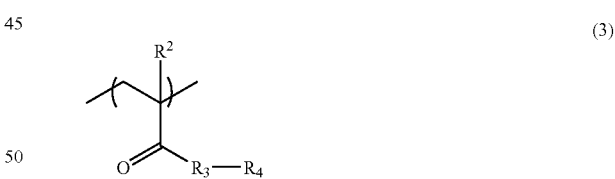

(3)

In Formula (3), $R^2$ denotes a hydrogen atom or a methyl group, $R^3$ denotes —O— or —NH—, and $R^4$ denotes a group having an ethylenically unsaturated group.

$R^4$ denotes a group having at least one ethylenically unsaturated group. The number of ethylenically unsaturated groups is preferably 1 or 2, and more preferably 1.

The ethylenically unsaturated group is not particularly limited as long as it is a group having a radically polymerizable ethylenically unsaturated bond; examples thereof include a (meth)acryloyl group, a (meth)acrylic group, a (meth)acryloylamide group, a styryl group, a vinyl group, an allyl group, a propenyl group, and a crotonyl group. Among them a (meth)acryloyl group, a (meth)acryloylamide group, and an allyl group are preferable, and a (meth)acryloyl group and an allyl group are more preferable.

The ethylenically unsaturated group and $R^3$ may be bonded to each other via a di- or higher-valent polyvalent linking group, and examples of the linking group include the partial structures below or a linking group formed by combination of the partial structures below.

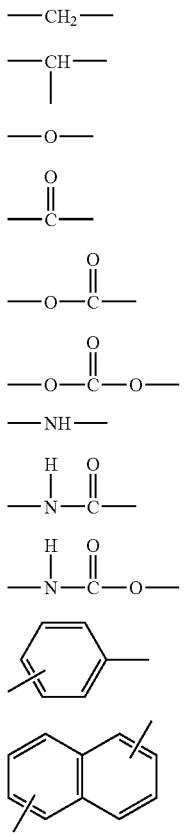

(R-1)
(R-2)
(R-3)
(R-4)
(R-5)
(R-6)
(R-7)
(R-8)
(R-9)
(R-10)
(R-11)

Among them, a linking group containing one or more of any of R-5, R-8, and R-10 is preferable.

$R^3$ and $R^4$ may further have a substituent. Examples of the substituent include an alkoxy group having 1 to 4 carbons, a halogen atom (a fluorine atom, a chlorine atom, a bromine atom, an iodine atom), an acyl group, an acyloxy group, a cyano group, a hydroxy group, a carboxy group, an alkoxycarbonyl group, and a nitro group. Among them, a hydroxy group is preferable.

The proportion of the monomer unit having an ethylenically unsaturated group in a side chain relative to the total monomer units contained in the specific fluorine-containing polymer is 40 to 99 mol %, more preferably 50 to 95 mol %, and yet more preferably 60 to 90 mol %. It is preferable for it to be in the above-mentioned range since the cured coating composition is excellent in terms of surface non-tackiness.

Other Monomer Unit

Furthermore, in the present invention, the specific fluorine-containing polymer may comprise a monomer unit other than the fluorine-containing monomer unit and the monomer unit having an ethylenically unsaturated group in a side chain.

The other monomer, which is copolymerizable with these monomers, is not particularly limited as long as it is a monofunctional monomer having only one ethylenically unsaturated bond, and specific examples thereof include radically polymerizable compounds, for example, unsaturated carboxylic acids such as acrylic acid, methacrylic acid, itaconic acid, crotonic acid, isocrotonic acid, and maleic acid, and salts thereof, anhydrides having an ethylenically unsaturated group, acrylonitrile, styrene, and various unsaturated polyesters, unsaturated polyethers, unsaturated polyamides, and unsaturated urethanes.

Specific examples thereof include (meth)acrylic acid derivatives such as methyl(meth)acrylate, ethyl(meth)acrylate, n-butyl(meth)acrylate, 2-ethylhexyl(meth)acrylate, 2-hydroxyethyl(meth)acrylate, butoxyethyl(meth)acrylate, carbitol(meth)acrylate, cyclohexyl(meth)acrylate, lauryl (meth)acrylate, tetrahydrofurfuryl(meth)acrylate, benzyl (meth)acrylate, N-methylol(meth)acrylamide, dimethylaminomethyl(meth)acrylate, diacetone(meth)acrylamide, glycidyl(meth)acrylate, epoxy(meth)acrylate, N-vinyl compounds such as N-vinylpyrrolidone and N-vinylcaprolactam, allyl compound derivatives such as allyl glycidyl ether, diallyl phthalate, and triallyl trimellitate and, more specifically, radically polymerizable or crosslinking monomers, oligomers, and polymers that are commercial products or are industrially known, such as those described in 'Kakyozai Handobukku' (Crosslinking Agent Handbook), Ed. S. Yamashita (Taiseisha, 1981); 'UV•EB Koka Handobukku' (UV•EB Curing Handbook) (Starting Materials) Ed. K. Kato (Kobunshi Kankoukai, 1985); 'UV•EB Koka Gijutsu no Oyo to Shijyo' (Application and Market of UV•EB Curing Technology), p. 79, Ed. RadTech (CMC, 1989); and E. Takiyama 'Poriesuteru Jushi Handobukku' (Polyester Resin Handbook), (The Nikkan Kogyo Shimbun Ltd., 1988) may be used.

Furthermore, the fluorine-containing polymer having an ethylenically unsaturated bond is preferably a polymer represented by Formula (4) below.

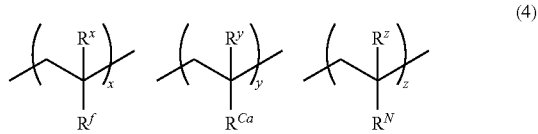

(4)

In Formula (4), $R^f$ denotes a fluorine atom-containing group, $R^{Ca}$ denotes a group having an ethylenically unsaturated bond, $R^N$ denotes an organic group that does not contain a fluorine atom or an ethylenically unsaturated bond, $R^x$, $R^y$ and $R^z$ independently denotes a hydrogen atom or a methyl group, x denotes 1 to 60, y denotes 40 to 99, z denotes 0 to 59 and x+y+z=100.

$R^f$ in Formula (4) denotes a fluorine atom-containing group, and is preferably a group having a fluorine atom-containing group Rf represented by Formula (2).

$R^{Ca}$ in Formula (4) denotes a group having an ethylenically unsaturated bond, and is preferably —COO$R^D$ or —CONHR$^D$. Said $R^D$ denotes a group having at least one ethylenically unsaturated group, preferably a group having 1 or 2 ethylenically unsaturated groups, and more preferably a group having one ethylenically unsaturated group.

$R^N$ in Formula (4) denotes an organic group that does not contain a fluorine atom or an ethylenically unsaturated bond, and is preferably —COO$R^E$ or —CONHR$^E$. Said $R^E$ denotes a monovalent organic group, preferably a hydrocarbon group having 1 to 20 carbons, and more preferably a methyl group.

x, y, and z in Formula (4) denote the molar ratio of each monomer unit, and x+y+z=100.

x in Formula (4) denotes 1 to 60, preferably 3 to 50, more preferably 5 to 40, and particularly preferably 10 to 20.

y in Formula (4) denotes 40 to 99, preferably 50 to 95, and more preferably 60 to 90.

z in Formula (4) denotes 0 to 59, preferably 0 to 20, and more preferably 0.

With regard to each of the monomer units in Formula (4), one type may be used on its own, or two or more types may be used in combination.

The terminus of the polymer represented by Formula (4) is preferably a hydrogen atom.

Specific examples (Compound Examples (P-1) to (P-14)) of the fluorine-containing polymer having an ethylenically unsaturated bond that can suitably be used in the present invention are listed below, but the present invention is not limited thereto. In the present invention, a hydrocarbon chain in the chemical formulae is sometimes represented by a simplified structural formula in which symbols for carbon (C) and hydrogen (H) are omitted. In the specific examples below, figures appended to the brackets of each monomer unit denote the molar ratio of each monomer unit in the polymer.

P-1

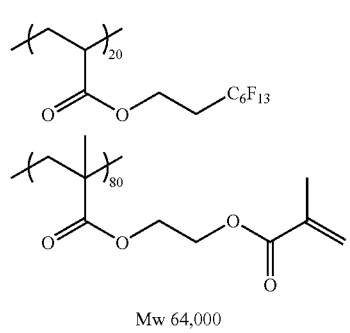

Mw 64,000

P-2

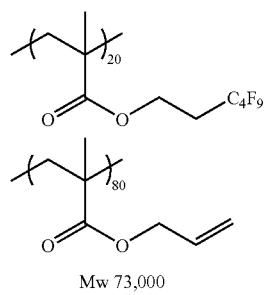

Mw 73,000

P-3

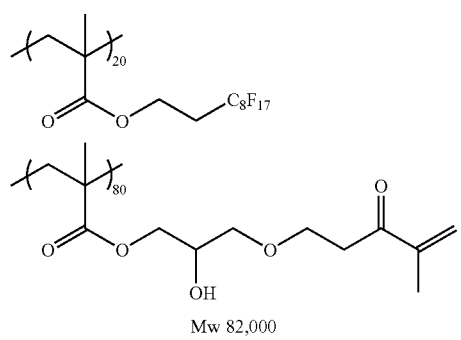

Mw 82,000

P-4

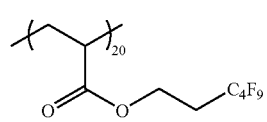

P-5

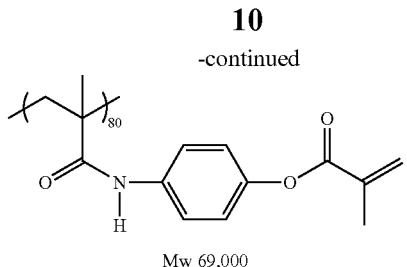

Mw 69,000

P-6

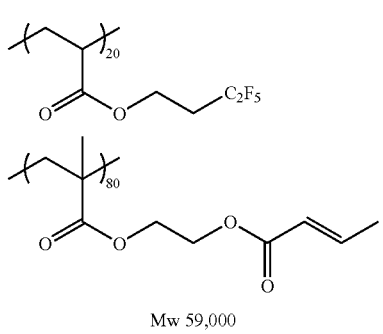

Mw 59,000

P-7

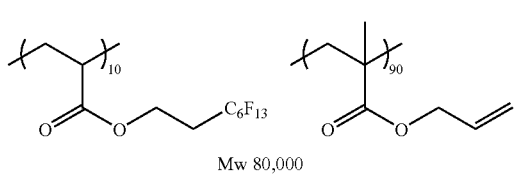

Mw 80,000

P-8

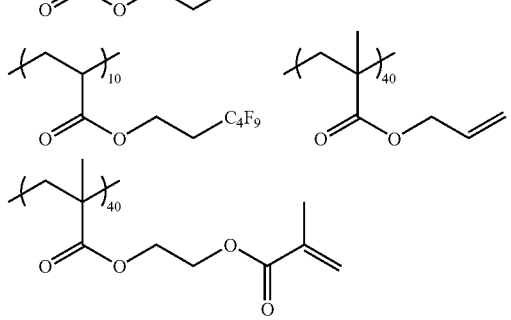

Mw 90,000

P-9

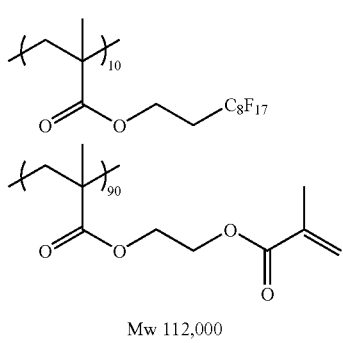

Mw 112,000

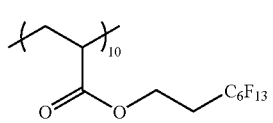

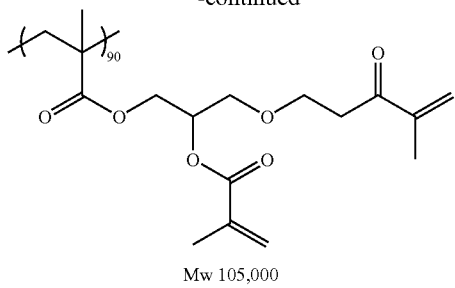

Mw 105,000

P-10

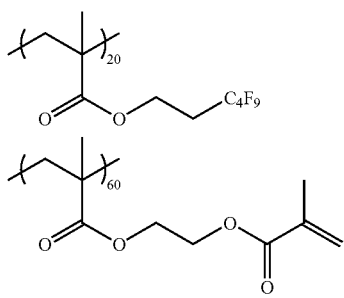

Mw 96,000

P-11

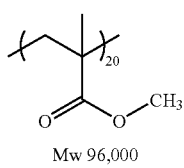

Mw 69,000

P-12

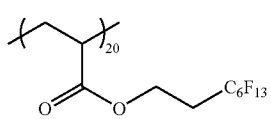

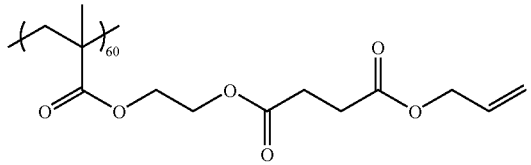

Mw 76,000

P-13

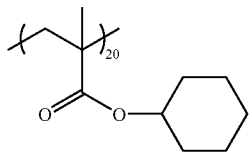

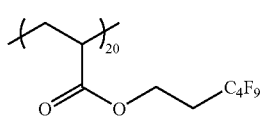

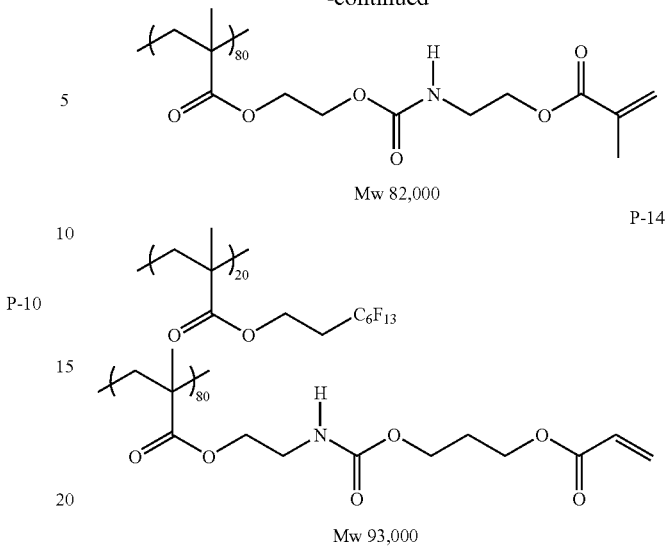

Among P-1 to P-14 above, P-1 to P-3, P-6 to P-8, P-11, and P-12 are preferable.

The amount of ethylenically unsaturated bonds introduced into the fluorine-containing polymer having an ethylenically unsaturated bond is preferably in the range of 0.1 to 100 mmol/g, and more preferably in the range of 0.2 to 80 mmol/g. When the amount thereof introduced is at least 0.1 mmol/g, the performance in suppressing surface tackiness (non-tackiness) is excellent, and when it is no greater than 100 mmol/g, storage stability is excellent.

The weight-average molecular weight of the specific fluorine-containing polymer is preferably 5,000 to 200,000, more preferably 30,000 to 150,000, and yet more preferably 50,000 to 120,000.

When the weight-average molecular weight of the specific fluorine-containing polymer is at least 5,000, the surface curability is excellent, thus giving excellent non-tackiness. On the other hand, when the weight-average molecular weight of the specific fluorine-containing polymer is no greater than 200,000, the solubility in a coating composition is excellent.

From the viewpoint of surface tackiness suppression (non-tackiness) and surface smoothness, the content of the specific fluorine-containing polymer in the photocurable coating composition of the present invention, relative to the total weight of the photocurable coating composition, is preferably in the range of 0.001 to 40 wt %, more preferably in the range of 0.01 to 30 wt %, yet more preferably in the range of 0.1 to 20 wt %, and particularly preferably in the range of 0.5 to 5 wt %.

(II) Ethylenically Unsaturated Compound

The photocurable coating composition of the present invention comprises (II) an ethylenically unsaturated compound.

The ethylenically unsaturated compound that can be used in the present invention is not particularly limited as long as it is a compound that has an ethylenically unsaturated bond and is radically or cationically polymerizable. Furthermore, the compound having an ethylenically unsaturated bond that can be used in the present invention is preferably a compound that is copolymerizable with the fluorine-containing polymer having an ethylenically unsaturated bond. Furthermore, the ethylenically unsaturated compound preferably comprises a polyfunctional ethylenically unsaturated compound, and more preferably a monofunctional ethylenically unsaturated compound and a polyfunctional ethylenically unsaturated compound.

In the present invention, the ethylenically unsaturated compound may be any compound as long as it has at least one ethylenically unsaturated bond, and a monomer, an oligomer, a polymer, etc. are included.

With regard to the ethylenically unsaturated compound, one type thereof may be used or, in order to improve intended properties, two or more types may be used in combination at any ratio. From the viewpoint of controlling reactivity, physical properties, etc., it is preferable to use two or more types of radically polymerizable compounds in combination.

Examples of the radically polymerizable ethlenically unsaturated compound include unsaturated carboxylic acids such as acrylic acid, methacrylic acid, itaconic acid, crotonic acid, isocrotonic acid, maleic acid, (meth)acrylate, (meth) acrylamide and salts thereof, anhydrides having an ethylenically unsaturated bond, acrylonitrile, styrene, various types of unsaturated polyesters, unsaturated polyethers, unsaturated polyamides, and unsaturated urethanes.

The term '(meth)acrylate' denotes an acrylate or a methacrylate, and '(meth)acrylamide' denotes an acrylamide or a methacrylamide. In the present invention, for example, a monofunctional (meth)acrylate compound means a compound that has only one (meth)acryloxy group but may further have an ethylenically unsaturated bond other than the (meth)acryloxy group.

Specific examples thereof include acrylic acid derivatives such as methyl acrylate, ethyl acrylate, n-butyl acrylate, 2-ethylhexyl acrylate, 2-hydroxyethyl acrylate, butoxyethyl acrylate, carbitol acrylate, cyclohexyl acrylate, tetrahydrofurfuryl acrylate, benzyl acrylate, bis(4-acryloxypolyethoxyphenyl)propane, neopentyl glycol diacrylate, 1,6-hexanediol diacrylate, ethylene glycol diacrylate, diethylene glycol diacrylate, triethylene glycol diacrylate, tetraethylene glycol diacrylate, polyethylene glycol diacrylate, polypropylene glycol diacrylate, pentaerythritol triacrylate, pentaerythritol tetraacrylate, dipentaerythritol tetraacrylate, trimethylolpropane triacrylate, tetramethylolmethane tetraacrylate, oligoester acrylate, N-methylolacrylamide, diacetoneacrylamide, and epoxyacrylate, methacrylic derivatives such as methyl methacrylate, ethyl methacrylate, n-butyl methacrylate, 2-ethylhexyl methacrylate, lauryl methacrylate, allyl methacrylate, glycidyl methacrylate, benzyl methacrylate, dimethylaminomethyl methacrylate, 1,6-hexanediol dimethacrylate, ethylene glycol dimethacrylate, triethylene glycol dimethacrylate, polyethylene glycol dimethacrylate, polypropylene glycol dimethacrylate, trimethylolethane trimethacrylate, trimethylolpropane trimethacrylate, and 2,2-bis(4-methacryloxypolyethoxyphenyl)propane, N-vinyl compounds such as N-vinylpyrrolidone and N-vinylcaprolactam, allyl compound derivatives such as allyl glycidyl ether, diallyl phthalate, and triallyl trimellitate and, more specifically, radically polymerizable or crosslinking monomers, oligomers, and polymers that are commercial products or are industrially known, such as those described in 'Kakyozai Handobukku' (Crosslinking Agent Handbook), Ed. S. Yamashita (Taiseisha, 1981); 'UV•EB Koka Handobukku' (UV•EB Curing Handbook) (Starting Materials) Ed. K. Kato (Kobunshi Kankoukai, 1985); 'UV•EB Koka Gijutsu no Oyo to Shijyo' (Application and Market of UV•EB Curing Technology), p. 79, Ed. Rad Tech (CMC, 1989); and E. Takiyama 'Poriesuteru Jushi Handobukku' (Polyester Resin Handbook), (The Nikkan Kogyo Shimbun Ltd., 1988) may be used.

Furthermore, as the radically polymerizable compound, photocuring polymerizable compound materials used in photopolymerizable compositions described in, for example, JP-A-7-159983, JP-B-7-31399 (JP-B denotes a Japanese examined patent application publication), JP-A-8-224982, JP-A-10-863, JP-A-9-134011, etc. are known, and they may be used in the coating composition of the present invention.

Moreover, as the radically polymerizable compound used in combination, a vinyl ether compound is also preferably used. Examples of vinyl ether compounds that can suitably be used include di- or tri-vinyl ether compounds such as ethylene glycol divinyl ether, diethylene glycol divinyl ether, triethylene glycol divinyl ether, propylene glycol divinyl ether, dipropylene glycol divinyl ether, butanediol divinyl ether, hexanediol divinyl ether, cyclohexanedimethanol divinyl ether, and trimethylolpropane trivinyl ether, and monovinyl ether compounds such as ethyl vinyl ether, n-butyl vinyl ether, isobutyl vinyl ether, cyclohexyl vinyl ether, hydroxybutyl vinyl ether, 2-ethylhexyl vinyl ether, cyclohexanedimethanol monovinyl ether, n-propyl vinyl ether, isopropyl vinyl ether, isopropenyl vinyl ether, dodecyl vinyl ether, diethylene glycol monovinyl ether, octadecyl vinyl ether, ethylene glycol monovinyl ether, triethylene glycol monovinyl ether, hydroxyethyl monovinyl ether, and hydroxynonyl monovinyl ether.

Among these vinyl ether compounds, divinyl ether compounds and trivinyl ether compounds are preferable from the viewpoint of curability, adhesion, and surface hardness, and divinyl ether compounds are particularly preferable. With regard to the vinyl ether compound, one type thereof may be used on its own or two or more types may be used in an appropriate combination.

As other polymerizable compounds that can be used in the present invention, (meth)acrylic acid esters such as (meth) acrylic-based monomers or prepolymers, epoxy-based monomers or prepolymers, or urethane-based monomers or prepolymers are preferably used. Preferred specific examples thereof are as follows.

That is, there can be cited 2-ethylhexyldiglycol acrylate, 2-hydroxy-3-phenoxypropyl acrylate, 2-hydroxybutyl acrylate, hydroxypivalic acid neopentyl glycol diacrylate, 2-acryloyloxyethylphthalic acid, methoxy polyethylene glycol acrylate, tetramethylolmethane triacrylate, 2-acryloyloxyethyl-2-hydroxyethylphthalic acid, dimethyloltricyclodecane diacrylate, ethoxylated phenyl acrylate, 2-acryloyxyethylsuccinic acid, nonylphenol ethylene oxide (EO) adduct acrylate, modified glycerol triacrylate, bisphenol A diglycidyl ether acrylic acid adduct, modified bisphenol A diacrylate, phenoxypolyethylene glycol acrylate, 2-acryloyloxyethylhexahydrophthalic acid, bisphenol A propylene oxide (PO) adduct diacrylate, bisphenol A EO adduct diacrylate, dipentaerythritol hexaacrylate, pentaerythritol triacrylate tolylene diisocyanate urethane prepolymer, lactone-modified flexible acrylate, butoxyethyl acrylate, propylene glycol diglycidyl ether acrylic acid adduct, pentaerythritol triacrylate hexamethylene diisocyanate urethane prepolymer, 2-hydroxyethyl acrylate, methoxydipropylene glycol acrylate, ditrimethylolpropane tetraacrylate, pentaerythritol triacrylate, hexamethylene diisocyanate urethane prepolymer, stearyl acrylate, isoamyl acrylate, isomyristyl acrylate, isostearyl acrylate, lactone-modified acrylate, and corresponding methacrylate compounds etc.

The (meth)acrylate compounds listed here have high reactivity, low viscosity, and excellent adhesion to a printing substrate.

The content of the ethylenically unsaturated compound in the photocurable coating composition of the present invention is preferably 50 to 95 wt % relative to the total weight of the photocurable coating composition, more preferably 55 to 90 wt %, and yet more preferably 60 to 85 wt %. When the content of the ethylenically unsaturated compound is at least 50 wt %, curing properties and film properties of the cured photocurable coating composition are excellent, and when it is no greater than 95 wt %, sensitivity is good and non-tackiness is excellent.

The photocurable coating composition of the present invention preferably comprises a polyfunctional ethylenically unsaturated compound as the ethylenically unsaturated compound, and more preferably a monofunctional ethylenically unsaturated compound and a polyfunctional ethylenically unsaturated compound.

When a polyfunctional ethylenically unsaturated compound is used, the content of the polyfunctional ethylenically unsaturated compound, relative to the total weight of the photocurable coating composition, is preferably 5 to 60 wt %. When the content of the polyfunctional ethylenically unsaturated compound is at least 5 wt %, non-tackiness is excellent, and when it is no greater than 60 wt %, the viscosity of the photocurable coating composition is appropriate, thus giving excellent surface smoothness.

In the present invention, depending on various intended applications, a radical/cationic hybrid coating composition may be employed in which a combination of the radically polymerizable compound and a radical polymerization initiator is used together with a combination of a cationically polymerizable compound described below and a cationic polymerization initiator.

The cationically polymerizable compound that can be used in the present invention is not particularly limited as long as it is a compound for which a polymerization reaction is initiated by an acid generated from a photo-acid generator and that cures, and various types of known cationically polymerizable monomers known as cationically photopolymerizable monomers may be used.

Examples of the cationically polymerizable monomer include epoxy compounds, vinyl ether compounds, and oxetane compounds described in JP-A-6-9714, JP-A-2001-31892, JP-A-2001-40068, JP-A-2001-55507, JP-A-2001-310938, JP-A-2001-310937, JP-A-2001-220526, etc.

Furthermore, as the cationically polymerizable compound, for example, a polymerizable compound applied in a photocurable resin of a cationic polymerization system is known, and in recent years polymerizable compounds applied in photocurable resins of cationic photopolymerization systems sensitized to a visible light wavelength range of 400 nm or higher have been disclosed in, for example, JP-A-6-43633 and JP-A-8-324137. They may be applied in the coating composition of the present invention.

Photopolymerization Initiator

The coating composition of the present invention comprises a photopolymerization initiator.

As the photopolymerization initiator, a known polymerization initiator may be used. In the present invention, it is preferable to use a radical photopolymerization initiator.

The photopolymerization initiator used in the coating composition of the present invention is a compound that absorbs external energy from actinic radiation and generates a polymerization initiating species. Examples of the actinic radiation include γ-rays, β-rays, an electron beam, UV rays, visible light, and IR rays. The wavelength used is not particularly limited, but is preferably a wavelength range of 200 to 500 nm, and more preferably 200 to 450 nm.

Preferred examples of the radical photopolymerization initiator that can be used in the present invention include (a) aromatic ketones, (b) acylphosphine compounds, (c) aromatic onium salt compounds, (d) organic peroxides, (e) thio compounds, (f) hexaarylbiimidazole compounds, (g) ketoxime ester compounds, (h) borate compounds, (i) azinium compounds, (j) metallocene compounds, (k) active ester compounds, (l) carbon-halogen bond-containing compounds, and (m) alkylamine compounds.

As a photopolymerization initiator that is preferable from the viewpoint of transparency, when the photopolymerization initiator is made into a 3 g/cm$^2$ thick film, a compound with an absorbance at a wavelength of 400 nm of no greater than 0.3 is preferable; it is more preferably no greater than 0.2, and yet more preferably no greater than 0.1.

Among the above, as a preferred photopolymerization initiator, there can be cited (a) aromatic ketones, (b) acylphosphine compounds, and (c) aromatic onium salt compounds.

With regard to the photopolymerization initiator in the present invention, one type thereof may be used on its own or two or more types thereof may be used in combination.

The content of the photopolymerization initiator in the present invention, relative to the total amount of the ethylenically unsaturated compound having an alicyclic hydrocarbon group and the other polymerizable compound used in combination, is preferably 0.01 to 35 wt %, more preferably 0.1 to 30 wt %, and yet more preferably 0.5 to 30 wt %.

Furthermore, when a sensitizer, which will be described later, is used, the ratio by weight of the photopolymerization initiator to the sensitizer (photopolymerization initiator: sensitizer) is preferably 200:1 to 1:200, more preferably 50:1 to 1:50, and yet more preferably 20:1 to 1:5.

In the present invention, as a cationic polymerization initiator (photo-acid generator) that is used in combination with a cationically polymerizable compound, for example, compounds that are used for chemically amplified photoresists or cationic photopolymerization are used (e.g. 'Imejingu you Yukizairyou' (Organic Materials for Imaging), Ed. The Japanese Research Association for Organic Electronics Materials, Bunshin Publishing Co. (1993), pp. 187-192).

Examples of cationic polymerization initiators that are suitable in the present invention are as follows.

That is, firstly, there can be cited $B(C_6F_5)_4^-$, $PF_6^-$, $AsF_6^-$, $SbF_6^-$, $CF_3SO_3^-$ salts of diazonium, ammonium, iodinium, sulfonium, phosphonium, etc. aromatic onium compounds. Secondly, there can be cited sulfonated materials that generate a sulfonic acid. Thirdly, halides that photogenerate a hydrogen halide can also be used. Fourthly, iron arene complexes can be used.

With regard to the above-mentioned cationic polymerization initiator, one type thereof may be used on its own or two or more types may be used in combination.

Sensitizer

A sensitizer may be added to the coating composition of the present invention in order to promote decomposition of the photopolymerization initiator by irradiation with actinic radiation.

The sensitizer absorbs specific actinic radiation and attains an electronically excited state. The sensitizer in the electronically excited state contacts the photopolymerization initiator and causes an action such as electron transfer, energy transfer, or generation of heat, thereby promoting chemical change of the photopolymerization initiator, that is, decomposition and generation of a radical, an acid, or a base.

With regard to the sensitizer that can be used in the present invention, it is preferable to use a compound or an amount for which effects such as coloring are small when the coating composition of the present invention is used in an overprint.

The content of the sensitizer in the present invention, relative to the total weight of the coating composition, is preferably 0.001 to 5 wt %, and more preferably 0.01 to 3 wt %. When the amount thereof added is in this range, the curability improves and there is little coloring effect.

As the sensitizer, a compound may be used that is appropriate for the wavelength of actinic radiation that generates an initiating species in the photopolymerization initiator used, but taking into consideration use in a curing reaction of a normal coating composition, preferred examples of the sensitizer include the types of compounds that come under those listed below and that have an absorption wavelength in the range of 350 nm to 450 nm.

Polynuclear aromatic compounds (e.g. pyrene, perylene, triphenylene), xanthenes (e.g. fluorescein, eosin, erythrosine, rhodamine B, rose bengal), cyanines (e.g. thiacarbocyanine, oxacarbocyanine), merocyanines (e.g. merocyanine, carbomerocyanine), thiazines (e.g. thionine, methylene blue, toluidine blue), acridines (e.g. acridine orange, chloroflavin, acriflavine), anthraquinones (e.g. anthraquinone), squaryliums (e.g. squarylium), coumarins (e.g. 7-diethylamino-4-methylcoumarin), and benzophenones (e.g. benzophenone).

Preferred examples of the sensitizer include compounds represented by Formulae (II) to (VI) below.

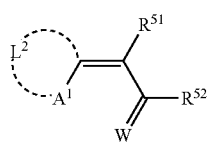

(II)

In Formula (II), $A^1$ denotes a sulfur atom or $NR^{50}$, $R^{50}$ denotes an alkyl group or an aryl group, $L^2$ denotes a non-metallic atomic group forming a basic nucleus in cooperation with the adjacent $A^1$ and carbon atom, $R^{51}$ and $R^{52}$ independently denote a hydrogen atom or a monovalent non-metallic atomic group, and $R^{51}$ and $R^{52}$ may be bonded together to form an acidic nucleus. W denotes an oxygen atom or a sulfur atom.

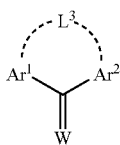

(III)

In Formula (III), $Ar^1$ and $Ar^2$ independently denote an aryl group and are connected to each other via bonding to -$L^3$-. Here, $L^3$ denotes —O— or —S—. W has the same meaning as that shown in Formula (II).

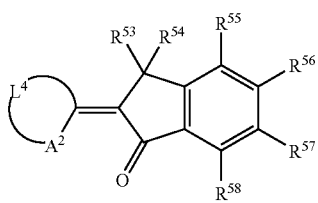

(IV)

In Formula (IV), $A^2$ denotes a sulfur atom or $NR^{59}$, $L^4$ denotes a non-metallic atomic group forming a basic nucleus in cooperation with the adjacent $A^2$ and carbon atom, $R^{53}$, $R^{54}$, $R^{55}$, $R^{56}$, $R^{57}$, and $R^{58}$ independently denote a monovalent non-metallic atomic group, and $R^{59}$ denotes an alkyl group or an aryl group.

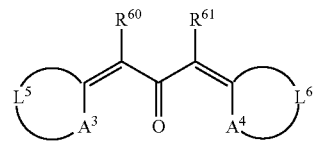

(V)

In Formula (V), $A^3$ and $A^4$ independently denote —S—, —$NR^{62}$—, or —$NR^{63}$—, $R^{62}$ and $R^{63}$ independently denote a substituted or unsubstituted alkyl group, or a substituted or unsubstituted aryl group, $L^5$ and $L^6$ independently denote a non-metallic atomic group forming a basic nucleus in cooperation with the adjacent $A^3$ and $A^4$ and adjacent carbon atom, and $R^{60}$ and $R^{61}$ independently denote a hydrogen atom or a monovalent non-metallic atomic group, or are bonded to each other to form an aliphatic or aromatic ring.

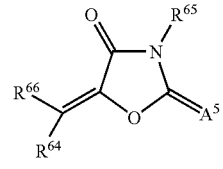

(VI)

In Formula (VI), $R^{66}$ denotes an optionally substituted aromatic ring or hetero ring, and $A^5$ denotes an oxygen atom, a sulfur atom, or $NR^{67}$. $R^{64}$, $R^{65}$, and $R^{67}$ independently denote a hydrogen atom or a monovalent non-metallic atomic group, and $R^{67}$ and $R^{64}$, and $R^{65}$ and $R^{67}$ may be bonded to each other to form an aliphatic or aromatic ring.

Preferred specific examples of the compound represented by Formulae (II) to (VI) are listed below.

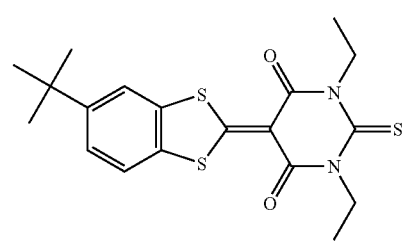

(E-1)

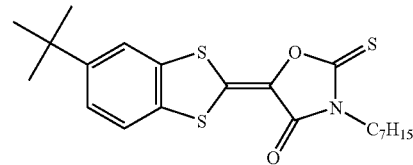

(E-2)

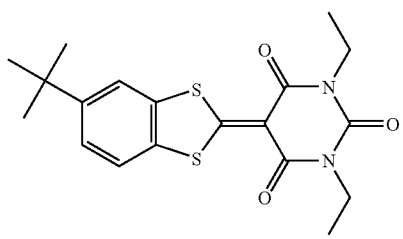
(E-3)
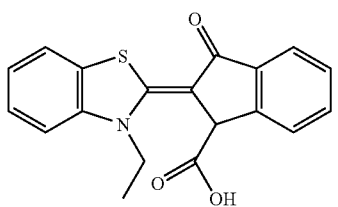
(E-4)
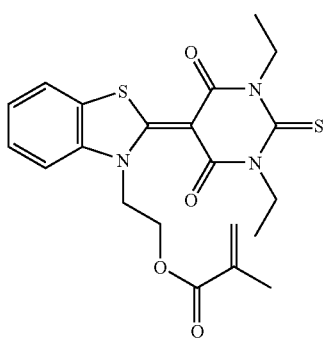
(E-5)
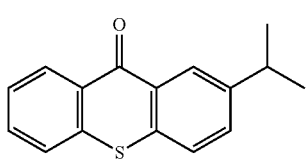
(E-6)
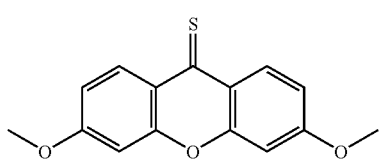
(E-7)
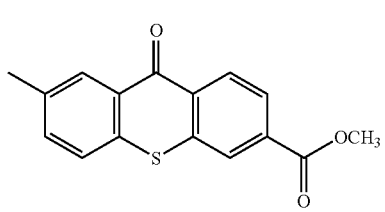
(E-8)
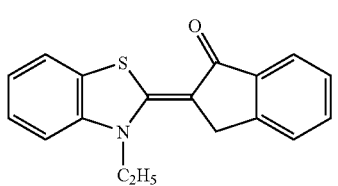
(E-9)
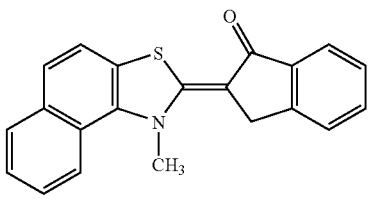
(E-10)
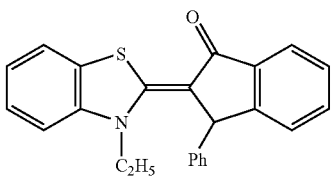
(E-11)
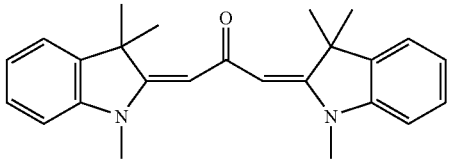
(E-12)
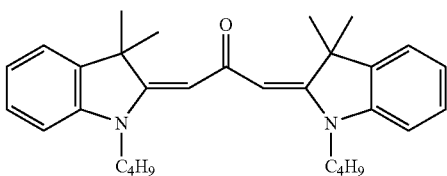
(E-13)
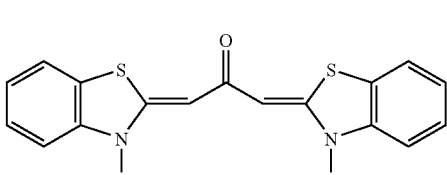
(E-14)
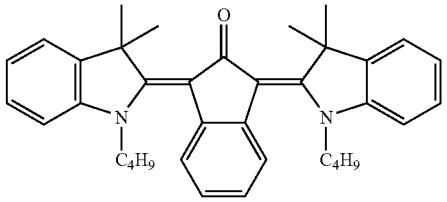
(E-15)
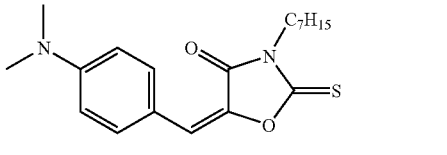
(E-16)
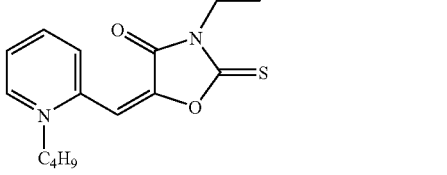
(E-17)

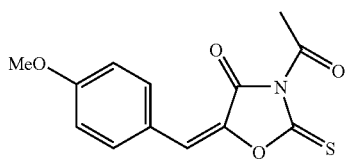
(E-18)

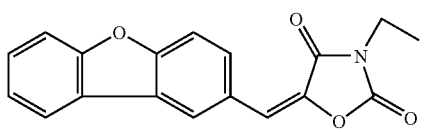
(E-19)

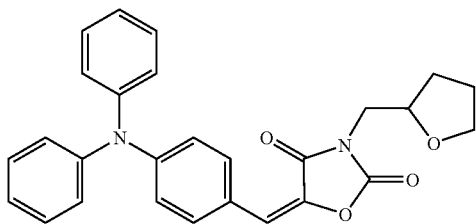
(E-20)

Co-sensitizer

The coating composition of the present invention may comprise a co-sensitizer.

In the present invention, the co-sensitizer has a function of further improving the sensitivity of a sensitizer toward actinic radiation, suppressing inhibition of polymerization of a polymerizable compound by oxygen, etc.

Examples of such a co-sensitizer include amines such as compounds described in M. R. Sander et al., Journal of Polymer Society, Vol. 10, p. 3173 (1972), JP-B-44-20189, JP-A-51-82102, JP-A-52-134692, JP-A-59-138205, JP-A-60-84305, JP-A-62-18537, JP-A-64-33104, and Research Disclosure 33825.

Specific examples thereof include triethanolamine, ethyl p-dimethylaminobenzoate, p-formyldimethylaniline, and p-methylthiodimethylaniline.

Other examples of the co-sensitizer include thiols and sulfides such as thiol compounds described in JP-A-53-702, JP-PCT-55-500806 (JP-PCT denotes a published Japanese translation of a PCT application), and JP-A-5-142772, and disulfide compounds described in JP-A-56-75643.

Specific examples thereof include 2-mercaptobenzothiazole, 2-mercaptobenzoxazole, 2-mercaptobenzoimidazole, 2-mercapto-4(3H)-quinazoline, and β-mercaptonaphthalene.

Other examples thereof include amino acid compounds (e.g. N-phenylglycine), organometallic compounds described in JP-B-48-42965 (e.g. tributyltin acetate), hydrogen donors described in JP-B-55-34414, sulfur compounds described in JP-A-6-308727 (e.g. trithiane), phosphorus compounds described in JP-A-6-250387 (e.g. diethylphosphite), and Si—H and Ge—H compounds described in JP-A-8-54735.

Surfactant

The coating composition of the present invention may comprise a surfactant.

As the surfactant, those described in JP-A-62-173463 and JP-A-62-183457 can be cited. Examples thereof include anionic surfactants such as dialkylsulfosuccinic acid salts, alkylnaphthalenesulfonic acid salts, and fatty acid salts, nonionic surfactants such as polyoxyethylene alkyl ethers, polyoxyethylene alkyl aryl ethers, acetylene glycols, and polyoxyethylene/polyoxypropylene block copolymers, and cationic surfactants such as alkylamine salts and quaternary ammonium salts. An organofluoro compound or a polysiloxane compound may be used as the surfactant. The organofluoro compound is preferably hydrophobic. Examples of the organofluoro compound include fluorine-based surfactants, oil-like fluorine-based compounds (e.g. fluorine oil), solid fluorine compound resins (e.g. tetrafluoroethylene resin), and those described in JP-B-57-9053 (paragraphs 8 to 17) and JP-A-62-135826. Among them, polydimethylsiloxane is preferable as the surfactant.

With regard to these surfactants, one type thereof may be used on its own or two or more types may be used in combination.

Other Components

Other components may be added to the coating composition of the present invention as necessary. Examples of said other components include a polymerization inhibitor, a solvent, inorganic particles, and organic particles.

The polymerization inhibitor may be added from the viewpoint of enhancing the storage stability. The polymerization inhibitor is preferably added at 200 to 20,000 ppm relative to the total amount of the coating composition of the present invention.

Examples of the polymerization inhibitor include hydroquinone, benzoquinone, p-methoxyphenol, TEMPO, TEMPOL, and Al cupferron.

It is possible to form an overprint layer or an overprint with intentionally degraded surface gloss by adding inorganic particles such as AEROSIL (silicon dioxide particles, manufactured by Degussa Inc.) or organic particles such as crosslinked polymethyl methacrylate (PMMA) to the coating composition of the present invention.

Taking into consideration the coating composition of the present invention being a radiation curable type coating composition, it is preferable for it not to contain any solvent so that the coating composition of the present invention can react quickly and be cured after coating. However, as long as the curing speed, etc. of the coating composition is not greatly affected, a specified solvent may be added.

In the present invention, an organic solvent may be used as the solvent, and from the viewpoint of curing speed, it is preferable for substantially no water to be added. The organic solvent may be added in order to improve adhesion to a printing substrate (an image receiving substrate such as paper).

When an organic solvent is used, the smaller the amount thereof, the more preferable it is, and it is preferably 0.1 to 5 wt % relative to the total weight of the coating composition of the present invention, and more preferably 0.1 to 3 wt %.

In addition to the above, a known compound may be added to the coating composition of the present invention as necessary.

Examples thereof include a leveling additive, a matting agent and, for adjusting film physical properties, a polyester-based resin, polyurethane-based resin, vinyl-based resin, acrylic-based resin, rubber-based resin, or wax, which may be appropriately selected and added.

Furthermore, in order to improve the adhesion to a printing substrate such as a polyolefin or polyethylene terephthalate (PET), a tackifier that does not inhibit polymerization is preferably added. Specific examples of the tackifier include high molecular weight tacky polymers described on pp. 5 and 6 of JP-A-2001-49200 (e.g. a copolymer formed from an ester of (meth)acrylic acid and an alcohol having an alkyl group having 1 to 20 carbons, an ester of (meth)acrylic acid and an alicyclic alcohol having 3 to 14 carbons, or an ester of (meth)

acrylic acid and an aromatic alcohol having 6 to 14 carbons), and a low molecular weight tackifying resin having a polymerizable unsaturated bond.

Properties of Photocurable Coating Composition

Preferred physical properties of the photocurable coating composition of the present invention are now explained.

When used as a photocurable coating composition, while taking into consideration coating properties, the viscosity at 25° C. to 30° C. is preferably 5 to 100 mPa·s, and more preferably 7 to 75 mPa·s.

The compositional ratio of the photocurable coating composition of the present invention is preferably adjusted as appropriate so that the viscosity is in the above range.

Setting the viscosity at 25° C. to 30° C. at the above value enables an overprint having an overprint layer with excellent non-tackiness (no surface tackiness) and excellent surface smoothness to be obtained.

The surface tension of the photocurable coating composition of the present invention is preferably 16 to 40 mN/m, and more preferably 18 to 35 mN/m.

Overprint and Process for Producing Same

The overprint of the present invention has, on a printed material, an overprint layer in which the coating composition of the present invention is photocured.

The overprint referred to here is one in which at least one overprint layer is formed on the surface of a printed material obtained by a printing method such as electrophotographic printing, inkjet printing, screen printing, flexographic printing, lithographic printing, intaglio printing, or relief printing.

The overprint layer in the overprint of the present invention may be formed on part of a printed material or may be formed on the entire surface of a printed material, and in the case of a double-side printed material, it is preferable to form the overprint layer on the entire surface of a printing substrate on both sides. Furthermore, needless to say, the overprint layer may be formed on an unprinted area of a printed material.

A printed material used for the overprint of the present invention is preferably an electrophotographically printed material. Forming an overprint layer, which is a cured layer of the coating composition of the present invention, on an electrophotographically printed material enables an overprint that has excellent non-tackiness, surface smoothness, and gloss and is visually similar to a silver halide photographic print to be obtained.

Furthermore, since the overprint of the present invention has excellent non-tackiness, even when a plurality of prepared overprints of the present invention are superimposed on each other and stored for a long period of time, the overprints do not stick to each other, and the storage properties are excellent.

The thickness of the overprint layer in the overprint of the present invention is preferably 1 to 10 μm, and more preferably 3 to 6 μm.

A method for measuring the thickness of the overprint layer is not particularly limited, but preferred examples thereof include a measurement method in which a cross section of an overprint is examined using an optical microscope, etc.

The process for producing an overprint of the present invention preferably comprises a step of obtaining a printed material by carrying out printing on a printing substrate, a step of coating the printed material with the photocurable coating composition of the present invention, and a step of photocuring the photocurable coating composition.

Furthermore, the process for producing an overprint of the present invention preferably comprises a step of generating an electrostatic latent image on a latent image support, a step of developing the electrostatic latent image using a toner, a step of obtaining an electrophotographically printed material by transferring the developed electrostatic image onto a printing substrate, a step of coating the electrophotographically printed material with the photocurable coating composition of the present invention, and a step of photocuring the photocurable coating composition.

The printing substrate is not particularly limited, and a known substrate may be used, but an image receiving paper is preferable, plain paper or coated paper is more preferable, and coated paper is yet more preferable. As the coated paper, a double-sided coated paper is preferable since a full color image can be attractively printed on both sides. When the printing substrate is paper or a double-sided coated paper, the paper weight is preferably 20 to 200 g/m$^2$, and more preferably 40 to 160 g/m$^2$.

A method for developing an image in the electrophotographic process is not particularly limited, and any method may be selected from methods known to a person skilled in the art. Examples thereof include a cascade method, a touch down method, a powder cloud method, and a magnetic brush method.

Furthermore, examples of a method for transferring a developed image to a printing substrate include a method employing a corotron or a bias roll.

A fixing step of fixing an image in the electrophotographic process may be carried out by various appropriate methods. Examples thereof include flash fixing, thermal fixing, pressure fixing, and vapor fusing.

The image formation method, equipment, and system in the electrophotographic process are not particularly limited, and known ones may be used. Specific examples are described in the US Patents below.

U.S. Pat. Nos. 4,585,884, 4,584,253, 4,563,408, 4,265,990, 6,180,308, 6,212,347, 6,187,499, 5,966,570, 5,627,002, 5,366,840, 5,346,795, 5,223,368, and 5,826,147.

In order to apply the photocurable coating composition, a commonly used liquid film coating device may be used. Specific examples thereof include a roller coater, a rod coater, a blade, a wire-wound bar, a dip coater, an air knife, a curtain coater, a slide coater, a doctor knife, a screen coater, a gravure coater, an offset gravure coater, a slot coater, and an extrusion coater. These devices may be used in the same manner as normal, and examples thereof include direct and reverse roll coating, blanket coating, dampener coating, curtain coating, lithographic coating, screen coating, and gravure coating. In a preferred embodiment, application and curing of the coating composition of the present invention are carried out using 2 or 3 roll coaters and UV curing stations.

Moreover, when coating or curing the coating composition of the present invention, heating may be carried out as necessary.

The coat weight of the coating composition of the present invention is preferably in the range of 1 to 10 g/m$^2$ as a weight per unit area, and more preferably 3 to 6 g/m$^2$.

Furthermore, the amount per unit area of an overprint layer formed in the overprint of the present invention is preferably in the range of 1 to 10 g/m$^2$, and more preferably 3 to 6 g/m$^2$.

As an energy source used for initiating polymerization of the polymerizable compound contained in the coating composition of the present invention, for example, one having actinism (actinic radiation) such as radiation having a wavelength in the UV or visible spectrum can be cited. Polymerization by irradiation with actinic radiation is excellent for initiating polymerization and regulating the speed of polymerization.

As a preferred actinic radiation source, for example, there are a mercury lamp, a xenon lamp, a carbon arc lamp, a tungsten filament lamp, a laser, and sunlight.

It is preferable to carry out irradiation using a high speed conveyor (preferably 15 to 70 m/min) under irradiation with UV rays (UV light irradiation) using a medium pressure mercury lamp, and in this case UV light irradiation is preferably carried out at a wavelength of 200 to 500 nm for less than 1 sec. Preferably, the speed of the high speed conveyor is 15 to 35 m/min, and UV light having a wavelength of 200 to 450 nm is applied for 10 to 50 milliseconds (ms). The emission spectrum of a UV light source normally overlaps the absorption spectrum of a UV polymerization initiator. Depending on the situation, curing equipment used may include, without being limited to, a reflection plate for focusing or diffusing UV light or a cooling system for removing heat generated by a UV light source.

In accordance with the present invention, there can be provided a photocurable coating composition giving excellent surface smoothness, and an overprint having excellent non-tackiness and surface smoothness and a process for producing same by applying and curing the photocurable coating composition.

EXAMPLES

The present invention is explained in further detail below by reference to Examples, but the present invention is not limited to modes in these Examples.

Method for Synthesizing Specific Fluorine-containing Polymer (P-1)

A solution of R-1620 (Daikin Industries, Ltd.) (0.2 mol), a compound having the structure below (q-1) (0.8 mol), and 2,2'-azobis(2-methylbutyronitrile) (Wako Pure Chemical Industries, Ltd.) (0.01 mol) in 1-methoxy-2-propanol (300 g) was added dropwise to 1-methoxy-2-propanol (300 g) at 80° C. over 4 hours under a flow of nitrogen. After completion of the dropwise addition, stirring was further carried out at 85° C. for 3 hours, thus giving a 1-methoxy-2-propanol solution of a precursor (Q-1) to a polymer

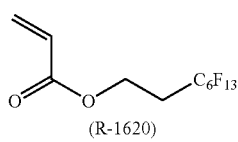

(R-1620)

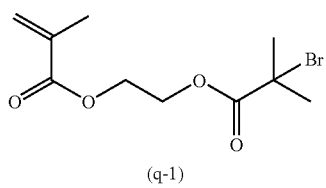

(q-1)

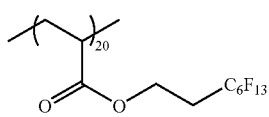

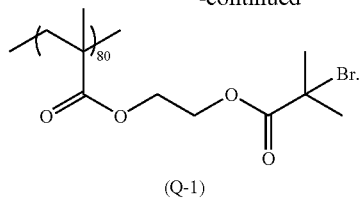

(Q-1)

The 1-methoxy-2-propanol solution of the precursor (Q-1) thus obtained was cooled to 0° C., 4,4-dimethylaminopyridine (0.8 mol) was added dropwise over 1 hour, the temperature of the mixture was gradually increased to room temperature, and a reaction was carried out at room temperature for 2 hours, thus giving the specific fluorine-containing polymer (P-1). When the weight-average molecular weight of the polymer (P-1) was measured by gel permeation chromatography, the weight-average molecular weight was found to be 64,000. The structure of the specific fluorine-containing polymer (P-1) thus obtained was identified by NMR.

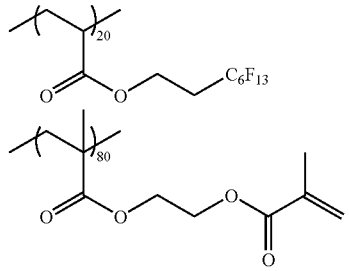

(P-1)

Method for Synthesizing Polymer (P-2)

A solution of M-1420 (Daikin Industries, Ltd.) (0.2 mol), allyl methacrylate (0.8 mol), and 2,2'-azobis(2-methylbutyronitrile) (Wako Pure Chemical Industries, Ltd.) (0.01 mol) in 1-methoxy-2-propanol (300 g) was added dropwise to 1-methoxy-2-propanol (300 g) at 80° C. over 4 hours under a flow of nitrogen. After completion of the dropwise addition, stirring was further carried out at 85° C. for 3 hours, thus giving a specific fluorine-containing polymer (P-2). When the weight-average molecular weight of the specific fluorine-containing polymer (P-2) was measured by gel permeation chromatography, the weight-average molecular weight was found to be 73,000. The structure of the specific fluorine-containing polymer (P-2) thus obtained was identified by NMR.

Polymers (P-3), (P-6) to (P-8), (P-10), and (P-11) were synthesized by the same method as above.

Example 1

The components below were stirred using a stirrer to give a photocurable coating composition.

| | |
|---|---|
| Trimethylolpropanetriacrylate (manufactured by Shin-Nakamura Chemical Co., Ltd.) | 40 wt % |
| Tripropyleneglycoldiacrylate (manufactured by Aldrich) | 20 wt % |
| Docecylacrylate (manufactured by Tokyo Chemical Industry Co., Ltd.) | 20 wt % |

-continued

| | |
|---|---|
| IRGACURE 907 (manufactured by Ciba Specialty Chemicals) | 15 wt % |
| Benzophenone (manufactured by Tokyo Chemical Industry Co., Ltd.) | 3 wt % |
| Specific fluorine-containing polymer shown in Table 1 | 2 wt % |

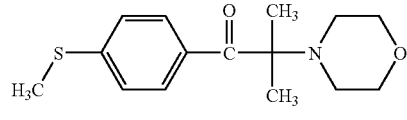

IRGACURE 907

Evaluation of the performance of the solvent-free photocurable coating composition of Example 1 thus obtained was carried out by the following methods.

Evaluation of Surface Smoothness (Leveling Properties)

An electrophotographically printed material obtained using double-sided coated paper output from a DC8000 digital printer manufactured by Fuji Xerox Co., Ltd. was coated on one side with the coating composition at a film thickness of 5 g/m$^2$ using an SG610V UV varnish coater manufactured by Shinano Kenshi Co., Ltd., and was subsequently exposed at 120 mJ/cm$^2$ with an illumination intensity of 1.0 W/cm$^2$, thus giving an overprint sample. The condition of the surface of the coated printed material was visually evaluated in terms of the occurrence of longitudinal lines. The evaluation criteria are shown below.

Excellent: no longitudinal lines.
Good: slight longitudinal lines observed.
Poor: longitudinal lines observed.

Evaluation of Non-tackiness (Suppression of Surface Tackiness)

An electrophotographically printed material obtained using double-sided coated paper output from a DC8000 digital printer manufactured by Fuji Xerox Co., Ltd. was coated on one side with the coating composition at a film thickness of 5 g/m$^2$ using a bar coater, and the film coating thus obtained was exposed at 120 mJ/cm$^2$ with an illumination intensity of 1.0 W/cm$^2$ using an LC8 UV lamp manufactured by Hamamatsu Photonics K.K., thus giving an overprint sample. The non-tackiness after light exposure was evaluated by touch. The evaluation criteria are shown below.

Excellent: no tackiness
Good: almost no tackiness
Fair: slight tackiness
Poor: surface uncured The result of evaluation by the methods above was that the photocurable coating composition of Example 1 gave 'good' for surface smoothness and 'good' for non-tackiness.

Examples 2 to 8 and Comparative Examples 1 to 4

Photocurable coating compositions were prepared by the same method as in Example 1 except that the polymer was changed to a polymer described in Table 1, overprints were then prepared using the compositions, and evaluation of the performance thereof was carried out. The evaluation results are shown together in Table 1.

Comparative Example 5

A photocurable coating composition was prepared by the same method as in Example 1 except that 22 wt % of trimethylolpropane triacrylate (62 wt % in total) (Shin-Nakamura Chemical Co., Ltd.) was used instead of the polymer of the present invention (2 wt %) and dodecyl acrylate (20 wt %) of Example 1; an overprint was prepared using same, and the performance thereof was evaluated. The evaluation results are together shown in Table 1.

TABLE 1

| Example Comparative Example | Polymer | Evaluation item | |
|---|---|---|---|
| | | Surface smoothness (leveling) | Non-tackiness (surface tackiness suppression) |
| Ex. 1 | P-1 | Excellent | Excellent |
| Ex. 2 | P-2 | Excellent | Excellent |
| Ex. 3 | P-3 | Excellent | Excellent |
| Ex. 4 | P-6 | Excellent | Excellent |
| Ex. 5 | P-7 | Excellent | Excellent |
| Ex. 6 | P-8 | Excellent | Excellent |
| Ex. 7 | P-10 | Excellent | Excellent |
| Ex. 8 | P-11 | Excellent | Excellent |
| Comp. Ex. 1 | Z-1 | Good | Poor |
| Comp. Ex. 2 | Z-2 | Excellent | Poor |
| Comp. Ex. 3 | Z-3 | Poor | Poor |
| Comp. Ex. 4 | Z-4 | Poor | Poor |
| Comp. Ex. 5 | None | Poor | Good |

Z-1 to Z-4 in the table denote compounds Z-1 to Z-4 below.
Z-1: polysiloxane-based polymer BYK-3510 (BYK Chemie)

Z-2  Mw 76,000

Z-3 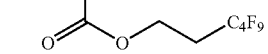 Mw 87,000

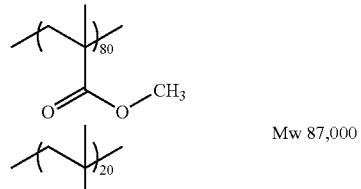

Z-4 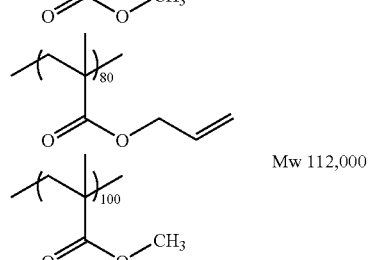 Mw 112,000

Example 9

20 sheets of printed material were prepared by electrophotographically printing full color images, each having a few frames, on both sides of A4 double-sided coated paper (paper weight 100 g/m$^2$), both sides of the printed materials were coated with the photocurable coating compositions prepared in Examples 1 to 8 above by the same method as in Example 1 at a coat weight of 5 g/m$^2$, and then irradiated with UV rays, thus giving double-sided overprints. When they were bound to give a photo album together with a cover, a photo album giving the same visibility as that given by a silver halide photographic print was obtained.

Example 10

10 sheets of printed material were prepared by electrophotographically printing a full color image including a menu photograph and text on both sides of substantially B4 double-sided coated paper (paper weight 100 g/m²), both sides of the printed materials were coated with the photocurable coating compositions prepared in Examples 1 to 8 above by the same method as in Example 1 at a coat weight of 5 g/m² per side, and then irradiated with UV rays, thus giving overprints on both sides. When they were bound to give a restaurant menu, a restaurant menu giving the same visibility as that given by a silver halide photographic print was obtained.

In Examples 1 to 8 above, the amount of overprint layer formed by coating one side of a printing substrate with a photocurable coating composition at a coat weight of 5 g/m² and curing it was 5 g/m² in each case.

Furthermore, the thickness of the overprint layer thus formed was about 5 μm in each case. The thickness of the overprint layer thus formed was measured by examining a cross section of the overprint using an optical microscope.

What is claimed is:

1. A process for producing an overprint, the process comprising in the following order:
   a step of preparing an electrophotographically printed material printed on an electrophotographic printing substrate;
   a step of coating the printed material with a photocurable composition; and
   a step of photocuring the photocurable composition;
   the photocurable composition comprising (I) a fluorine-containing polymer having an ethylenically unsaturated group, (II) an ethylenically unsaturated compound, and (III) a photopolymerization initiator,
   wherein the fluorine-containing polymer (I) comprises a monomer unit represented by Formula (1)

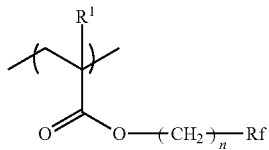

(1)

wherein Rf denotes a fluoroalkyl group or perfluoroalkyl group both containing at least 5 fluorine atoms, n denotes 1 or 2, and R¹ denotes a hydrogen atom or a methyl group.

2. The process for producing an overprint according to claim 1, wherein the ethylenically unsaturated compound (II) comprises a monofunctional ethylenically unsaturated compound and a polyfunctional ethylenically unsaturated compound.

3. The process for producing an overprint according to claim 1, wherein the photocurable composition is a composition whose light transmittance in a wavelength region of 400 to 700 nm is at least 70%.

4. The process for producing an overprint according to claim 1, wherein the fluorine-containing polymer (I) has a content of 0.001 to 40 wt % relative to the total weight of the photocurable composition.

5. The process for producing an overprint according to claim 1, wherein the ethylenically unsaturated compound (II) has a content of 50 to 95 wt % relative to the total weight of the photocurable composition.

6. The process for producing an overprint according to claim 1, wherein as the ethylenically unsaturated compound (II) a polyfunctional ethylenically unsaturated compound is contained at 5 to 60 wt % relative to the total weight of the photocurable composition.

7. The process for producing an overprint according to claim 1, wherein the electrophotographically printed material is an electrophotographically printed material having a fuser oil layer.

8. The process for producing an overprint according to claim 1, wherein an amount of the photocurable composition on the printed material is 1 to 10 g/m².

9. The process for producing an overprint according to claim 1, wherein a thickness of the photocurable composition on the printed material is 1 to 10 μm.

10. An overprint produced by the process for producing an overprint according to claim 1.

11. A photocurable composition comprising:
   (I) a fluorine-containing polymer having an ethylenically unsaturated group;
   (II) an ethylenically unsaturated compound; and
   (III) a photopolymerization initiator,
   wherein the fluorine-containing polymer (I) comprises a monomer unit represented by Formula (1)

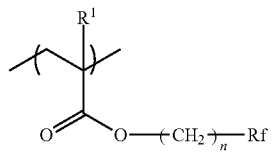

(1)

wherein Rf denotes a fluoroalkyl group or perfluoroalkyl group both containing at least 5 fluorine atoms, n denotes 1 or 2, and R¹ denotes a hydrogen atom or a methyl group.

12. The photocurable composition according to claim 11, wherein the ethylenically unsaturated compound (II) comprises a monofunctional ethylenically unsaturated compound and a polyfunctional ethylenically unsaturated compound.

13. The photocurable composition according to claim 11, wherein the fluorine-containing polymer (I) has a content of 0.001 to 40 wt % relative to the total weight of the photocurable composition.

14. The photocurable composition according to claim 11, wherein the ethylenically unsaturated compound (II) has a content of 50 to 95 wt % relative to the total weight of the photocurable composition.

15. The photocurable composition according to claim 12, wherein as the ethylenically unsaturated compound (II) a polyfunctional ethylenically unsaturated compound is contained at 5 to 60 wt % relative to the total weight of the photocurable composition.

16. The photocurable composition according to claim 11, whose light transmittance in a wavelength region of 400 to 700 nm is at least 70%.

17. The process for producing an overprint according to claim 1, wherein the step of photocuring the photocurable composition is a step of photocuring the entire photocurable composition.

18. The process for producing an overprint according to claim 1, wherein the fluorine-containing polymer (I) is a polymer represented by Formula (4),

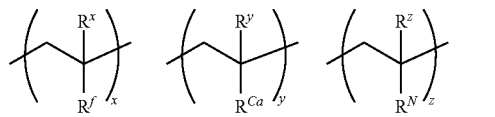
(4)

wherein $R^f$ denotes a fluorine atom-containing group, $R^{Ca}$ denotes a group having an ethylenically unsaturated bond, $R^N$ denotes an organic group that does not contain a fluorine atom or an ethylenically unsaturated bond, $R^x$, $R^y$ and $R^z$ independently denotes a hydrogen atom or a methyl group, x denotes 1 to 60, y denotes 40 to 99, z denotes 0 to 59, and x+y+z=100.

19. The process for producing an overprint according to claim 1, wherein the photocurable composition is a composition that has substantially no light absorption in a visible region of 400 to 700 nm.

20. The process for producing an overprint according to claim 2, wherein as the ethylenically unsaturated compound (II) a polyfunctional ethylenically unsaturated compound is contained at 5 to 60 wt % relative to the total weight of the photocurable composition.

21. A process for producing an overprint, the process comprising in the following order:
  a step of preparing an electrophotographically printed material printed on an electrophotographic printing substrate;
  a step of coating the printed material with a photocurable composition; and
  a step of photocuring the photocurable composition.

22. The process for producing an overprint according to claim 21, wherein the step of photocuring the photocurable composition is a step of photocuring the entire photocurable composition.

23. The photocurable composition according to claim 11, wherein the fluorine-containing polymer (I) is a polymer represented by Formula (4),

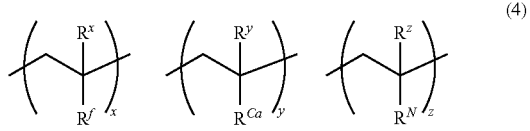
(4)

wherein $R^f$ denotes a fluorine atom-containing group, $R^{ca}$ denotes a group having an ethylenically unsaturated bond, $R^N$ denotes an organic group that does not contain a fluorine atom or an ethylenically unsaturated bond, $R^x$, $R^y$ and $R^z$ independently denotes a hydrogen atom or a methyl group, x denotes 1 to 60, y denotes 40 to 99, z denotes 0 to 59, and x+y+z=100.

24. The photocurable composition according to claim 11, wherein the photocurable composition is a composition that has substantially no light absorption in a visible region of 400 to 700 nm.

25. The process for producing an overprint according to claim 1, wherein a proportion of the monomer unit represented by Formula (1) relative to total monomer units contained in the fluorine-containing polymer (I) is 5 to 40 mol %.

26. The photocurable composition according to claim 11, wherein a proportion of the monomer unit represented by Formula (1) relative to total monomer units contained in the fluorine-containing polymer (I) is 5 to 40 mol %.

* * * * *